United States Patent
Tak et al.

(10) Patent No.: US 8,300,495 B2
(45) Date of Patent: Oct. 30, 2012

(54) BLOCK CONTROL COMMAND GENERATION CIRCUIT

(75) Inventors: Jung Mi Tak, Icheon-si (KR); Hyuck Soo Yoon, Icheon-si (KR); Ji Hyae Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 119 days.

(21) Appl. No.: 12/983,011

(22) Filed: Dec. 31, 2010

(65) Prior Publication Data

US 2012/0051153 A1 Mar. 1, 2012

(30) Foreign Application Priority Data

Aug. 27, 2010 (KR) .................. 10-2010-0083296

(51) Int. Cl.
*G11C 8/00* (2006.01)
(52) U.S. Cl. .......... 365/230.06; 365/189.05; 365/230.08
(58) Field of Classification Search ............. 365/189.05, 365/230.01, 230.06, 230.08
See application file for complete search history.

(56) References Cited

U.S. PATENT DOCUMENTS

| | | | |
|---|---|---|---|
| 6,215,723 B1 * | 4/2001 | Kang et al. | 365/230.06 |
| 6,353,570 B2 * | 3/2002 | Hwang et al. | 365/225.7 |
| 6,504,769 B2 * | 1/2003 | Do et al. | 365/200 |
| 6,928,002 B2 | 8/2005 | Shiga et al. | |
| 7,466,621 B2 * | 12/2008 | Lee | 365/230.06 |
| 7,663,922 B2 | 2/2010 | Park et al. | |
| 2004/0240254 A1 | 12/2004 | Shiga et al. | |
| 2010/0302840 A1 * | 12/2010 | Yoon | 365/163 |

FOREIGN PATENT DOCUMENTS

| | | |
|---|---|---|
| JP | 2002-150785 | 5/2002 |
| KR | 1019980034160 A | 8/1998 |
| KR | 1020060024146 A | 3/2006 |

* cited by examiner

*Primary Examiner* — VanThu Nguyen
(74) *Attorney, Agent, or Firm* — William Park & Associates Ltd.

(57) ABSTRACT

A block control command generation circuit includes first and second latch units, an input selection unit, a pull-down driving unit, and an output selection unit. The first and second latch units store initial values at different levels in response to initialization signals. The input selection unit selectively transmits a first block control signal to the first latch unit in response to an input enable signal. The pull-down driving unit selectively pull-down drives an input node of the second latch unit in response to a second block control signal and the input enable signal. The output selection unit outputs signals, which are stored in the first and second latch units, as first and second block control command signals in response to an output enable signal, respectively.

10 Claims, 3 Drawing Sheets

| Block Status | Input | | Output | |
|---|---|---|---|---|
| | LCKDB<1> | LCKDB<0> | LCKQ<1> | LCKQ<0> |
| Unlock | 1 | 1 | 0 | 0 |
| Lock | 1 | 0 | 0 | 1 |
| Lock-Down | 0 | 0 | 1 | 1 |

US 8,300,495 B2

BLOCK CONTROL COMMAND GENERATION CIRCUIT

The present application claims priority under 35 U.S.C. §119(a) to Korean application number 10-2010-0083296, filed on Aug. 27, 2010, in the Korean Intellectual Property Office, which is incorporated herein by reference in its entirety.

BACKGROUND

1. Technical Field

The present invention relates to a semiconductor memory apparatus, and more particularly, to a technology for generating a block control command signal used for controlling operation of a memory block.

2. Related Art

A memory area of a semiconductor memory apparatus is divided into a large number of memory blocks. Each memory block can be in a block lock state, a block unlock state, and a block lock-down state, where a particular state can be entered via a block control command.

A programming operation, a data erase operation, and an over-write operation are not allowed for a memory block in the block lock state or the block lock-down state. However, the programming operation, the data erase operation, and the over-write operation are permitted for a memory block in the block unlock state.

A block control command generation circuit is needed to generate block control commands for each memory block. Accordingly, if a semiconductor memory apparatus has 1024 memory blocks, then there may need to be 1024 block control command generation circuits corresponding to the 1024 memory blocks. As the number of memory blocks increase, more chip real estate will be taken up by the block control command generation circuits.

SUMMARY

In one embodiment of the present invention, a block control command generation circuit includes first and second latch units configured to store initial values at different levels in response to initialization signals; an input selection unit configured to selectively transmit a first block control signal to the first latch unit in response to an input enable signal; a pull-down driving unit configured to is selectively pull-down drive an input node of the second latch unit in response to a second block control signal and the input enable signal; and an output selection unit configured to output signals, which are stored in the first and second latch units, as first and second block control command signals, respectively, in response to an output enable signal.

In another embodiment of the present invention, a block control command generation circuit includes first and second latch units configured to store initial values at different levels in response to initialization signals; a first input selection unit configured to selectively transmit a first block control signal to the first latch unit in response to an input enable signal; a logic unit configured to output a transmission control signal by logically combining a second block control signal and the input enable signal; a second input selection unit configured to selectively transmit the second block control signal to the second latch unit under a control of the transmission control signal; and an output selection unit configured to output signals, which are stored in the first and second latch units, as first and second block control command signals, respectively, in response to an output enable signal.

BRIEF DESCRIPTION OF THE DRAWINGS

Features, aspects, and embodiments are described in conjunction with the attached drawings, in which.

DETAILED DESCRIPTION

Hereinafter, embodiments of the present invention will be described in detail with reference to the accompanying drawings such that the scope of the present invention can be easily embodied by those skilled in the art.

For reference, since terms, symbols, and signs that are used in drawings and in this detailed description to designate devices, blocks, and so on may be used for detailed units as the occasion demands, it is to be noted that the same terms, symbols, and signs may not designate the same devices, blocks, and so on in an entire circuitry. In general, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

Figure 1:
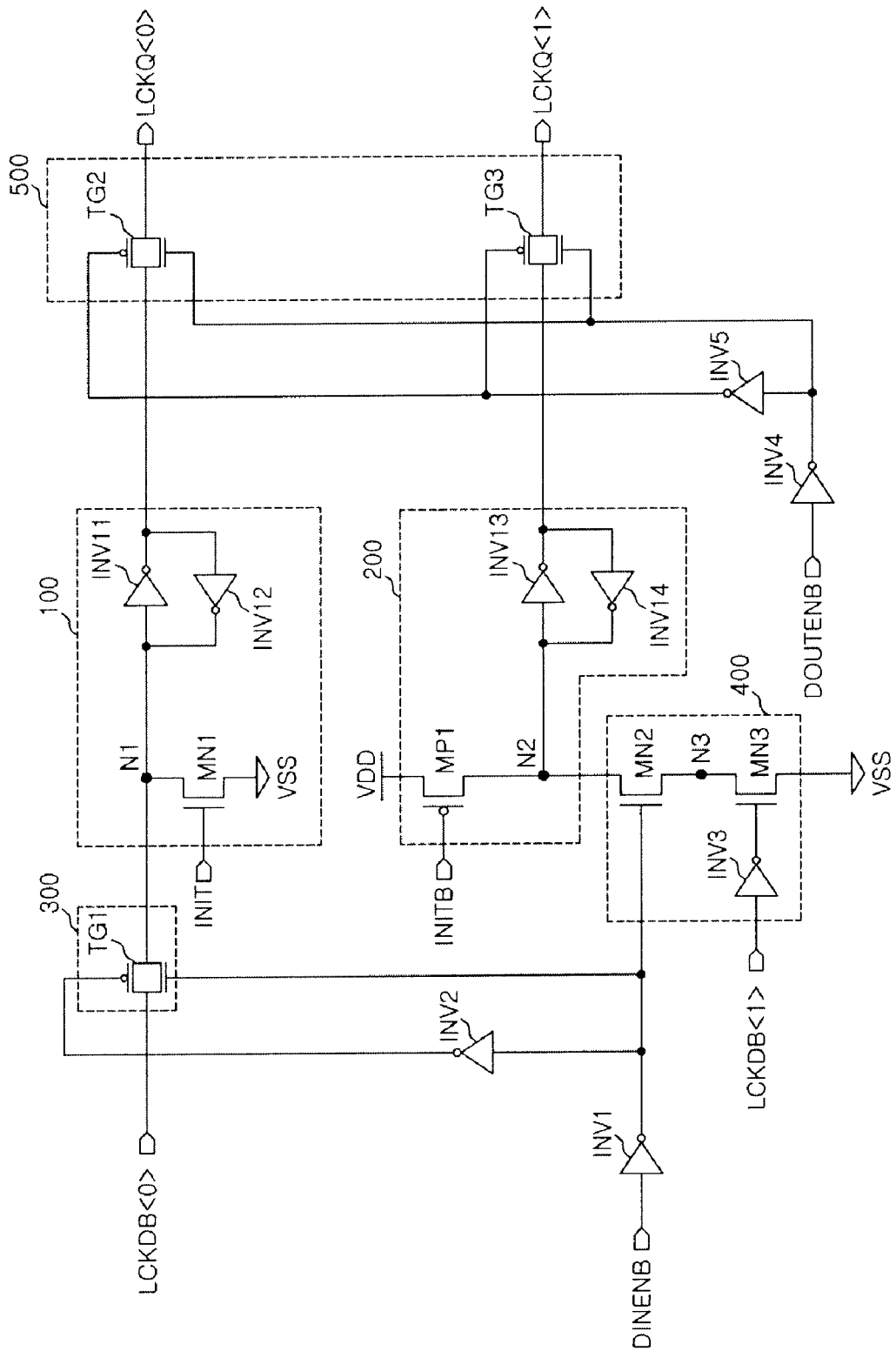
FIG. 1 is a configuration diagram of a block control is command generation circuit according to one embodiment.

FIG. 1 is a configuration diagram of a block control is command generation circuit according to one embodiment of the invention.

Referring to FIG. 1, the block control command generation circuit includes a first latch unit 100, a second latch unit 200, an input selection unit 300, a pull-down driving unit 400, and an output selection unit 500.

The detail configuration and principal operations of the block control command generation circuit configured as mentioned above will be described below.

The first latch unit 100 and the second latch unit 200 are configured to store initial values at different levels in response to initialization signals INIT and INITB. The initialization signals INIT and INITB may be differential signals. Generally, when a first signal name and a second signal name are the same except that the second signal name has a postfix of "B," the postfix "B" indicates that the second signal is an inverted version of the first signal. Generally, a signal ending in "B" may be an active low signal, while those signals not ending in "B" may be active high signals. The initialization signals INIT and INITB may be defined as signals which are asserted at power-up, and, accordingly, may be defined as reset signals generated by an internal control circuit.

In one embodiment, the first latch unit 100 includes a first initialization section MN1 that pull-down drives a first input node N1 under the control of the initialization signal INIT, and inverters INV11 and INV12 that act to latch signals at the first input node N1. The first initialization section MN1 includes an NMOS transistor MN1 which is coupled between the first input node N1 and a ground voltage terminal VSS, and is controlled by the initialization signal INIT.

The second latch unit 200 includes a second initialization section MP1 that pull-up drives a second input node N2 under the control of the initialization signal INITB, and inverters INV13 and INV14 that act to latch signals at the second input node N2. The second initialization section MP1 includes a PMOS transistor MP1 which is coupled between a supply voltage terminal VDD and the second input node N2, and is controlled by the initialization signal INITB.

The input selection unit 300 is configured to selectively transmit a first block control signal LCKDB<0> to the first latch unit 100 in response to an input enable signal DINENB. In one embodiment, the input selection unit 300 includes a transmission gate TG1 controlled by the input enable signal DINENB.

The pull-down driving unit 400 is configured to selectively pull-down drive the input node N2 of the second latch unit 200 in response to a second block control signal LCKDB<1> and the input enable signal DINENB. In one embodiment, the pull-down driving unit 400 includes NMOS transistors MN2 and MN3, and an inverter INV3. The NMOS transistor MN2 is coupled between the input node N2 and a first node N3, and is controlled by an inverted version of the input enable signal DINENB. The NMOS transistor MN3 is coupled between the first node N3 and a ground VSS, and is controlled by the is second block control signal LCKDB<1>.

The output selection unit 500 is configured to receive outputs of the first and second latch units 100 and 200, and output first and second block control command signals LCKQ<0:1>. Output of the first and second block control command signals LCKQ<0:1> are enabled by an output enable signal DOUTENB. In one embodiment, the output selection unit 500 includes a plurality of transmission gates TG2 and TG3 controlled by the output enable signal DOUTENB. Thus, when the output enable signal DOUTENB is asserted, the output selection unit 500 will output the first block control command signal LCKQ<0> and the second block control command signal LCKQ<1>.

Figures 2, 3:
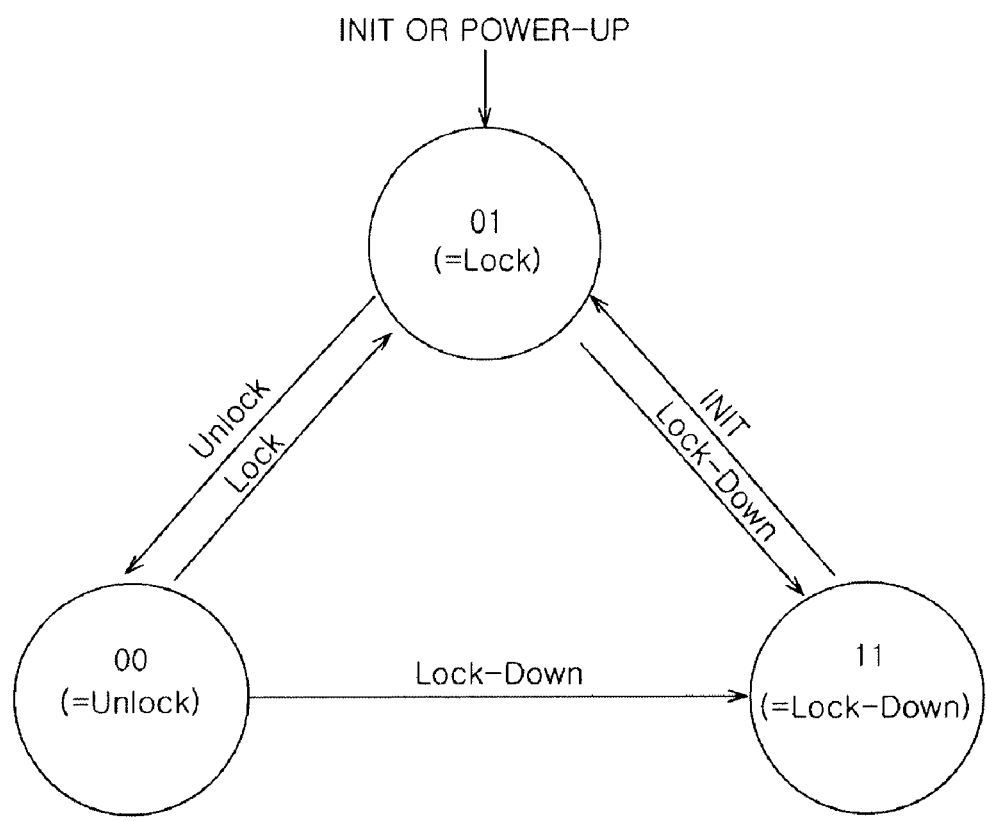
FIG. 2 is a diagram illustrating the state of an input/output signal of the block control command generation circuit illustrated in FIG. 1.
FIG. 3 is a state diagram illustrating the operation status of a memory block.

FIG. 2 is a diagram illustrating the state of an input/output signal of the block control command generation circuit illustrated in FIG. 1 and FIG. 3 is a state diagram illustrating the operation state of a memory block.

An operation in which the state of the memory block is changed under the control of the first block control command signal LCKQ<0> and the second block control command signal LCKQ<1>, which are outputted from the block control command generation circuit, will be described below with reference to FIGS. 1 to 3.

The block control command generation circuit is configured to output the first block control command signal LCKQ<0> and the second block control command signal LCKQ<1>, which may be used to put a memory block in one of block lock, block unlock, and block lock-down states.

The truth table of FIG. 2 shows the first block control command signal LCKQ<0> and the second block control command signal LCKQ<1> when the first block control command signal LCKDB<0> and the second block control command signal LCKDB<1> are input.

The state diagram of FIG. 3 shows how a memory block state can change from one the states block lock, block unlock, and block lock-down to another of those states. The state of a memory block is changed according to the first and second block control command signals LCKQ<0> and LCKQ<1> output by the block control command generation circuit shown in FIG. 1.

When the initialization signal INIT is asserted or the power-up operation is started, the memory blocks enter the block lock state. The state of a memory block may be changed to the block unlock status or the block lock-down status under the control of the first block control command signal LCKQ<0> and the second block control command signal LCKQ<1>. When the current state is the block unlock state, the memory block may be changed to the block lock state or the block lock-down state. When the current state is the to block lock-down state, the state of the memory block may not be changed under the control of the first block control command signal LCKQ<0> and the second block control command signal LCKQ<1>, and is changed to the block lock state (the initial state) only when the initialization signal INIT is asserted.

Figure 4:
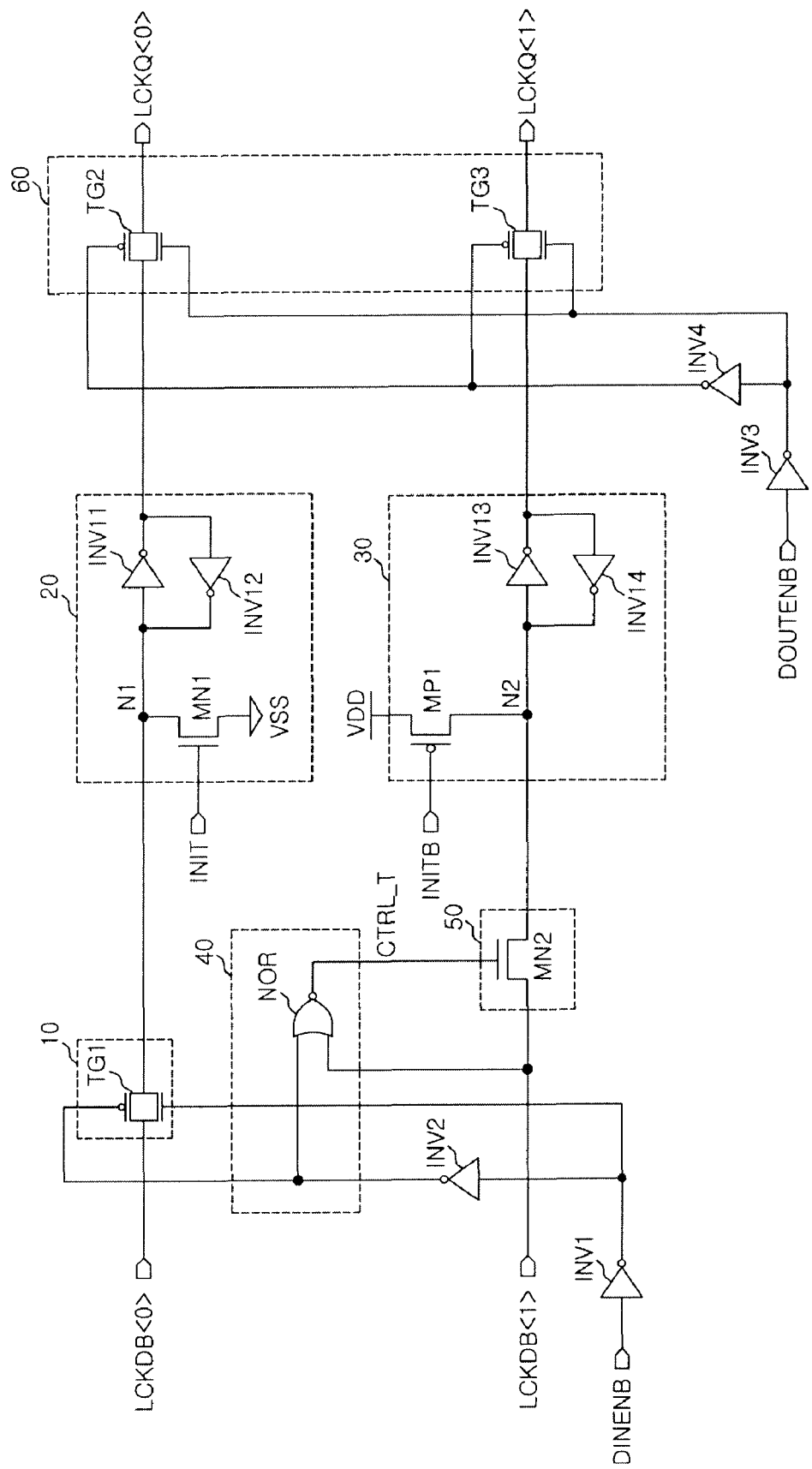
FIG. 4 is a configuration diagram of a block control command generation circuit according to another embodiment.

FIG. 4 is a configuration diagram of a block control command generation circuit according to another embodiment of the invention.

Referring to FIG. 4, the block control command generation circuit includes a first input selection unit 10, a first latch unit 20, a second latch unit 30, a logic unit 40, a second input selection unit 50, and an output selection unit 60.

The detail configuration and principal operations of the block control command generation circuit configured as mentioned above will be described below.

The first latch unit 20 and the second latch unit 30 are configured to store initial values at different levels in response to initialization signals INIT and INITB. The initialization signals INIT and INITB may be differential signals. The initialization signals INIT and INITB may be defined as signals that are asserted at the time of a power-up operation, and, accordingly, may be defined as reset signals generated by an internal control circuit.

In one embodiment, the first latch unit 20 includes a first initialization section MN1 that pull-down drives a first input node N1 under the control of the initialization signal INIT, and inverters INV11 and INV12 that act to latch signals at the first input node N1. The first initialization section MN1 includes an NMOS transistor MN1, which is coupled between the first input node N1 and a ground voltage terminal VSS, and is controlled by the initialization signal INIT.

The second latch unit 30 includes a second initialization section MP1 that pull-up drives a second input node N2 under the control of the initialization signal INITB, and inverters INV13 and INV14 that act to latch signals at the second input node N2. The second initialization section MP1 includes a PMOS transistor MP1, which is coupled between a supply voltage terminal VDD and the second input node N2, and is controlled by the initialization signal INITB.

The first input selection unit 10 is configured to selectively transmit a first block control signal LCKDB<0> to the first latch unit in response to an input enable signal DINENB. In one embodiment, the input selection unit 10 includes a transmission gate TG1 controlled by the input enable signal DINENB.

The logic unit 40 is configured to output a transmission control signal CTRL_T by logically combining the second block control signal LCKDB<1> and the input enable signal DINENB. In one embodiment, the logic unit 40 is a NORing element NOR that outputs the transmission control signal CTRL_T by performing a NOR operation on the second block control signal LCKDB<1> and the input enable signal DINENB.

The second input selection unit 50 is configured to selectively transmit the second block control signal LCKDB<1> to the second latch unit 30 under the control of the transmission control signal CTRL_T.

The output selection unit 60 is configured to receive outputs of the first and second latch units 20 and 30, and output first and second block control command signals LCKQ<0:1>. Output of the first and second block control command signals LCKQ<0:1> are enabled by an output enable signal DOUTENB. In one embodiment, the output selection unit 60 includes a plurality of transmission gates TG2 and TG3 controlled by the output enable signal DOUTENB. Thus, when the output enable signal DOUTENB is asserted, the output selection unit 60 outputs the first block control command signal LCKQ<0> and the second block control command signal LCKQ<1>.

The block control command generation circuit illustrated in FIG. 4 performs the same operation as that of the block control command generation circuit illustrated in FIG. 1. Thus, as illustrated in the truth table of FIG. 2 and the state diagram of FIG. 3, the block control command generation circuit outputs appropriate first and second block control command signal LCKQ<0:1> according to the received input first and second block control signals LCKDB<0:1>

The state of a memory block is changed according to the first block control command signal LCKQ<0> and the second block control command signal LCKQ<1> output by the block control command generation circuit shown. Since the block control command generation circuit illustrated in FIG. 4 performs the same operation as that of the block control command generation circuit illustrated in FIG. 1, detailed description thereof will be omitted in order to avoid redundancy.

As a result, the block control command generation circuit according to various embodiments of the invention may receive the is first block control command signal LCKQ<0> and the second block control command signal LCKQ<1>. The received signal may be stored, and output as needed.

So far, the embodiment of the present invention has been described in detail. For reference, embodiments including additional component elements, which are not directly associated with the technical spirit of the present invention, may be exemplified in order to describe the present invention in further detail. Moreover, an active high configuration or an active low configuration for indicating the asserted states of signals and circuits may vary depending upon an embodiment.

Furthermore, the configurations of transistors may be changed as the occasion demands to realize the same function. That is, a PMOS transistor and an NMOS transistor may be replaced with each other, and control signals for the transistors may be modified as the occasion demands. Various transistors and types of transistors may be employed to offer similar functionality. Furthermore, the configurations of logic gates may be changed as the occasion demands in order to realize the same function. That is, a NANDing element, a NORing element, and the like may be realized through various combinations of a NAND gate, a NOR gate, an inverter, and the like. Since these changes can result in a large number of embodiments and can be easily inferred by those skilled in the art, the enumeration thereof will be omitted herein.

While certain embodiments have been described above, it is will be understood to those skilled in the art that the embodiments described are by way of example only. Accordingly, a block control command generation circuit described herein should not be limited based on the described embodiments. Rather, the block control command generation circuit described herein should only be limited in light of the claims that follow when taken in conjunction with the above description and accompanying drawings.

What is claimed is:

1. A block control command generation circuit comprising:
   first and second latch units configured to store initial values at different levels in response to initialization signals;
   an input selection unit configured to selectively transmit a first block control signal to the first latch unit in response to an input enable signal;
   a pull-down driving unit configured to selectively pull-down drive an input node of the second latch unit in response to a second block control signal and the input enable signal; and
   an output selection unit configured to output signals stored in the first and second latch units as first and second block control command signals, respectively, in response to an output enable signal.

2. The block control command generation circuit according to claim 1, wherein the initialization signals are asserted upon power-up.

3. The block control command generation circuit according to claim 1, wherein the first latch unit comprises:
   a first initialization section configured to pull-down drive a first input node under a control of at least one of the initialization signals; and
   a first latch configured to latch a signal transmitted through the first input node.

4. The block control command generation circuit according to claim 1, wherein the second latch unit comprises:
   a second initialization section configured to pull-up drive a second input node under the control of at least one of the initialization signals; and
   a second latch configured to latch a signal transmitted through the second input node.

5. The block control command generation circuit according to claim 1, wherein the pull-down driving unit comprises:
   a first transistor coupled between the input node of the second is latch unit and a first node, and controlled by the input enable signal; and
   a second transistor coupled between the first node and a ground voltage terminal, and controlled by the second block control signal.

6. A block control command generation circuit comprising:
   first and second latch units configured to store initial values at different levels in response to initialization signals;
   a first input selection unit configured to selectively transmit a first block control signal to the first latch unit in response to an input enable signal;
   a logic unit configured to output a transmission control signal by logically combining a second block control signal and the input enable signal;
   a second input selection unit configured to selectively transmit the second block control signal to the second latch unit under a control of the transmission control signal; and
   an output selection unit configured to output signals stored in the first and second latch units as first and second block control command signals, respectively, in response to an output enable signal.

7. The block control command generation circuit according to claim 6, wherein the initialization signals are asserted at power-up.

8. The block control command generation circuit according to claim 6, wherein the logic unit is configured to output the transmission control signal by performing a NOR operation on the second block control signal and the input enable signal.

9. The block control command generation circuit according to claim 6, wherein the first latch unit comprises:

a first initialization section configured to pull-down drive a first input node under a control of at least one of the initialization signals; and a first latch configured to latch a signal transmitted through the first input node.

10. The block control command generation circuit according to claim 6, wherein the second latch unit comprises:

a second initialization section configured to pull-up drive a second input node under the control of at least one of the initialization signals; and a second latch configured to latch a signal transmitted through the second input node.

* * * * *